United States Patent [19]
Czornyj et al.

[11] Patent Number: 5,446,074
[45] Date of Patent: Aug. 29, 1995

[54] PHOTOSENSITIVE POLYIMIDE PRECURSORS

[75] Inventors: George Czornyj, Poughkeepsie, N.Y.; Moonhor Ree, Kyongbuk, Rep. of Korea; Willi Volksen, San Jose, Calif.; Dominic C. Yang, Woodbury, Conn.

[73] Assignee: International Business Machines Corporation, Armonk, N.Y.

[21] Appl. No.: 169,801

[22] Filed: Dec. 17, 1993

[51] Int. Cl.$^6$ .............. G03C 1/52; C08G 69/26; C08J 3/28
[52] U.S. Cl. .............. 522/164; 522/904; 522/905; 522/136; 430/195; 430/281; 430/194; 525/420; 525/436; 525/928; 528/128; 528/229; 528/335
[58] Field of Search .............. 522/14, 111, 149, 164, 522/136, 904; 525/420, 436, 928; 528/128, 229, 335; 430/194, 195, 281

[56] References Cited

U.S. PATENT DOCUMENTS

| | | | |
|---|---|---|---|
| 3,072,485 | 8/1960 | Reynolds et al. | 522/904 |
| 4,107,174 | 8/1978 | Baumann et al. | 260/326 |
| 4,168,366 | 9/1979 | D'Alelio | 522/164 |
| 4,416,973 | 11/1983 | Goff | 522/149 |
| 4,430,418 | 2/1984 | Goff | 522/164 |
| 4,451,551 | 5/1984 | Kataoka et al. | 522/136 |
| 4,454,220 | 6/1984 | Goff | 522/164 |
| 4,481,340 | 11/1984 | Minnema et al. | 522/149 |
| 4,629,777 | 12/1986 | Pfeifer | 528/353 |
| 4,656,116 | 4/1987 | Rohde et al. | 430/197 |
| 4,670,535 | 6/1987 | Sugio et al. | 528/220 |
| 4,696,890 | 9/1987 | Pfeifer | 430/325 |
| 4,698,295 | 10/1987 | Pfeifer et al. | 430/325 |
| 4,803,147 | 2/1989 | Mueller et al. | 430/288 |
| 4,814,233 | 3/1989 | Pfeifer | 428/522 |
| 4,829,131 | 5/1989 | Lee | 525/426 |
| 4,830,953 | 5/1989 | Bateman | 430/197 |
| 4,851,506 | 7/1989 | Rohde et al. | 528/353 |
| 5,238,784 | 8/1993 | Tokoh et al. | 522/136 |

FOREIGN PATENT DOCUMENTS 2305821 12/1990 Japan ................... 522/164

OTHER PUBLICATIONS

Ray, S., Berger, D., Czornyg, G., Kumer, A., and Tummala, R., "Dual-Level Metal (DLM) Method for Fabricating Thin Film Wiring Structures", 43rd Electronics Components and Technology Conference (ECTC-IEEE) 1993, pp. 538–543.

Tummala, Rao R., Haley, Michael R., and Czornyj, George, "Materials in Micro-Electronics", *Ceramics International*, vol. 19(3), 1993, p. 191.

*Primary Examiner*—Susan W. Berman
*Attorney, Agent, or Firm*—Whitham, Curtis, Whitham & McGinn; Dale M. Crockatt

[57] ABSTRACT

New photosensitive polyamic acid precursors are disclosed which have the formula:

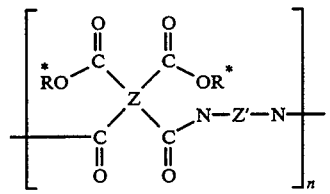

where Z is a tetravalent organic radical which contains at least one aromatic ring, Z' is a divalent organic radical which contains at least one aromatic ring, and R* is a photosensitive group. Particularly preferred compounds include BPDA-PDA and BPDA-ODA polyamic acid precursors. The precursor compositions within the practice of this invention are i-line, g-line, and i-/g-line active and show good photoresolution. The films formed exhibit excellent self-adhesion and adhesion to glass ceramic and silicon wafer substrates have low internal stress, a very low degree of solvent swelling, high thermal stability, and excellent mechanical properties such as high modulus/tensile strength and high elongation at break.

2 Claims, No Drawings

PHOTOSENSITIVE POLYIMIDE PRECURSORS

BACKGROUND OF THE INVENTION

1. Field of the Invention

The present invention generally relates to photosensitive polyimides and, more particularly, to a polyamide acid precursor with photosensitive groups bonded to the carboxylic acid moieties.

2. Description of the Prior Art

Polyimides are condensation polymers derived from bifunctional carboxylic acid anhydrides and primary diamines. Aromatic polyimides exhibit outstanding mechanical properties for application in microelectronics manufacture and have excellent thermal and oxidative stability. It is well known that the mechanical properties, thermal stability, adhesion, swelling, morphology, dielectric constant, coefficient of thermal expansion, and residual stress are determined to a large extent by the choice of the diamine and dianhydride components used as starting materials. Polyimide materials which are currently commonly used in microelectronics manufacture are synthesized from the monomers noted in Table 1.

TABLE 1

| | Dianhydrides | | Diamines |
|---|---|---|---|
| 1) | 3,3'4,4'-biphenyltetra-carboxylic acid dianhydride (BPDA) | 1) | M- and P-phenylene-diamine (PMDA) |
| 2) | pyromellitic dianhydride (PMDA) | 2) | 4,4'-diaminodiphenyl ether (ODA) |
| 3) | benzophenone dianhydride (BTDA) | 3) | 4,4'-diaminodiphenyl methane (MDA) |

During manufacture of thin film structures, whether for chip or single or multi chip module packaging, the removal of solvents from the solvent based coatings as well as subjecting the films to numerous heating and cooling regimes for curing purposes generates residual stresses within the films. The residual stresses produced by the difference in the thermal expansion coefficients of the materials and the moduli of the various material layers can lead to film delamination, cracking of the metal or polyimide, and bowing of the substrates resulting in poor photolithographic image transfer. In view of these problems, low stress materials are highly desirable for thin film fabrication.

Pattern generation in polyimides is normally achieved using photolithographic processes where patterns are transferred to the polyimide using lift-off techniques. The disadvantage of these processes is that multiple processing steps are required. In order to reduce process steps and cost in high density chip wiring and integrated device packaging, photosensitive polyimides have gained much attention in the electronics industry. Photosensitive polyimides have the potential of allowing the manufacture of multi-layer packaging of high performance integrated circuit devices in small and dense scale with less processing steps.

However, many of the currently available photosensitive polyimides have poor mechanical properties, such as very low elongation break, low modulus, low tensile strength, and brittleness, high thermal expansion, relatively high dielectric constant, high swelling in solvent, poor thermal stability and low glass transition temperature. Bateman, U.S. Pat. No. 4,830,953, Pfeifer et al., U.S. Pat. No. 4,698,295, Mueller et al., U.S. Pat. No. 4,803,147, and Pfeifer, U.S. Pat. No. 4,629,777, all disclose photosensitive polyimides. However, there are many limiting factors associated with these products. For example, Bateman, Pfeiffer et al. and Mueller are only applicable to thin film use. In addition, all four of these products have poor photoresolution. Other problems associated with these products include poor thermal stability, high dielectric constant, poor adhesion, and poor mechanical properties especially after thermal cycling associated with multilayer thin film fabrication. Rohde et al., U.S. Pat. No. 4,656,116, discloses photosensitive polyimides which include aromatic tetracarboxylic acid derivatives such as BTDA and PMDA, and alkyl substituted aromatic diamines where the alkyl groups can be radiation crosslinked with organic chromophoric polyazides. However, the Rohde et al. polyimides lack many of the critical properties needed for circuit manufacture and have low photosensitivity and yield poor pattern resolution in film thickness required for thin film packaging. The photo-patterning results discussed in Rohde et al. were obtained at very thin film thickness (ca. 1-2 μm).

SUMMARY OF THE INVENTION

It is therefore an object of the present invention to provide a new class of photosensitive polyimides which have low thermal expansion, high modulus, high tensile strength, good elongation/toughness, high thermal stability, high glass transition temperature, low solvent swelling, good adhesion, and low dielectric constants.

It is another object of this invention to provide a new class of photosensitive polyimides which include photosensitive groups covalently bonded to the carboxylic acid moieties of the polyamic acid precursor.

It is yet another object of this invention to provide material which can be photoprocessed without the aid of a separate photoresist at ca. 8 μm–10 μm cured polyimide film thickness.

According to the invention, the new photosensitive polyamic acid precursors have the formula:

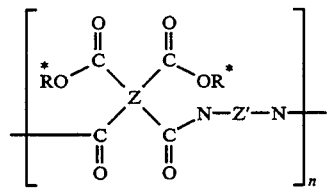

where Z is a tetravalent organic radical which contains at least one aromatic ring, Z' is a divalent organic radical which contains at least one aromatic ring, and R* is a photosensitive group. Particularly preferred compounds include BPDA-PDA and BPDA-ODA polyamide acid precursors. The precursor compositions within the practice of this invention are i-line, g-line, and i-/g-line both active. The films formed exhibit excellent self-adhesion and adhesion to ceramic, glass ceramic and silicon wafer substrates, have a very low degree of solvent swelling, high thermal stability, and excellent mechanical properties such as high modulus/tensile strength and high elongation at break.

DETAILED DESCRIPTION OF PREFERRED EMBODIMENTS OF THE INVENTION

Photosensitive polyamic acid precursors within the present invention have the formula:

mide) (BPDA-ODA) polyamide acid precursors and poly(p-phenylene biphenyltetra-carboximide) (BPDA-PDA) polyamic acid presursors. Chemical structures in schematics 1 and 2 show the BPDA-ODA and BPDA-PDA polyamide acid precursors, respectively, being used to make BPDA-ODA and BPDA-PDA polyimides.

Schematic 1. BPDA-ODA

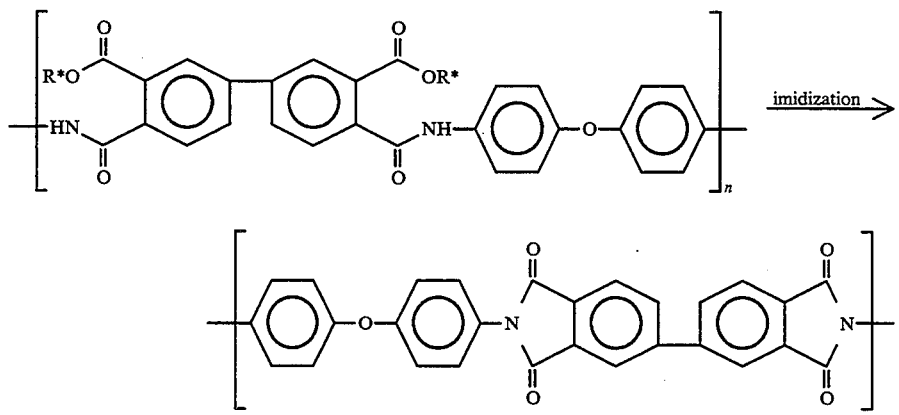

Schematic 2. BPDA-PDA

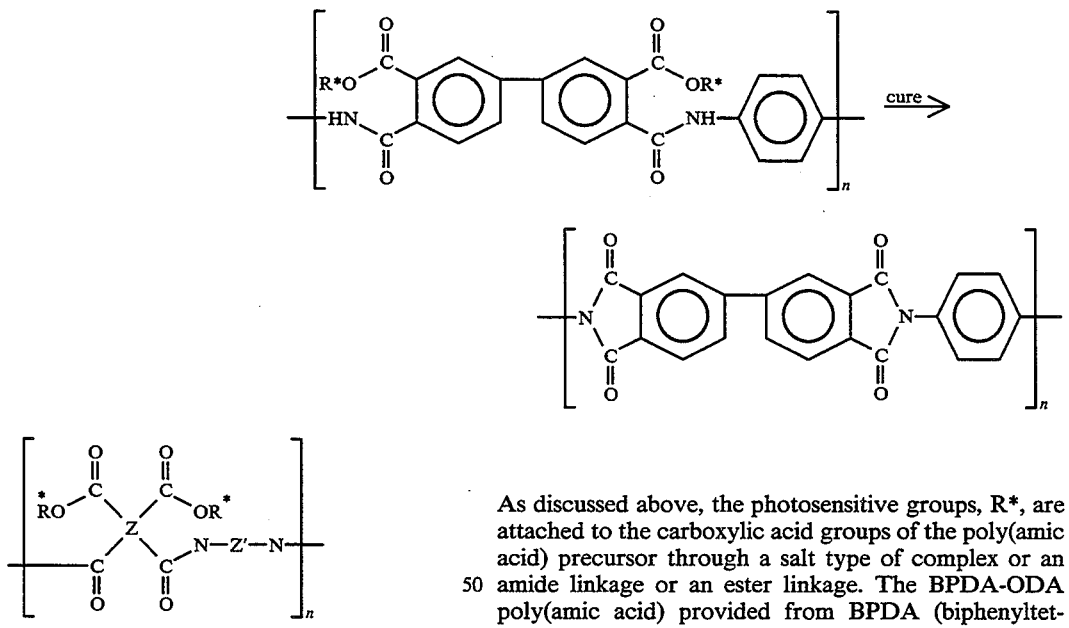

where Z is a tetravalent organic radical which contains at least one aromatic ring, Z' is a divalent organic radical which contains at least one aromatic ring, and R* is a photosensitive group. The compositions may be i-line, g-line, and i-/g-line both active. These compositions exhibit excellent self adhesion and adhesion to glass ceramic, ceramic, and silicon wafer substrates, very low degree of solvent swelling, high thermal stability, and excellent mechanical properties such as high modulus/tensile strength and high elongation at break, especially after thermal cycling the photosensitive groups, R*, are attached to the carbolic acid groups of the poly(amic acid) precursor through a salt type of complex or an amide linkage or an ester linkage.

Particularly preferred photosensitive compositions include poly(4,4'-oxydiphenylene biphenyltetraearboxi- As discussed above, the photosensitive groups, R*, are attached to the carboxylic acid groups of the poly(amic acid) precursor through a salt type of complex or an amide linkage or an ester linkage. The BPDA-ODA poly(amic acid) provided from BPDA (biphenyltetracarboxylic anhydride) and ODA (4,4'-oxydiphenylene diamine) averages 40,000 MW. The BPDA-PDA poly(amic acid) provided from BPDA (biphenyltetracarboxylic anhydride) and PDA (p-phenylene diamine) has averages 60,000 Mw.

The photosensitive R* are preferably based on polymerizable double bonded monomers such as 2-(dimethylamino)ethyl methacrylate, 2-(diethylamino)ethylmethacrylate, 2-(dimethylamino)ethyl acrylate, diethylaminoethyl acrylate, hydroxy ethyl methacrylate, isocyanotoethylmethacrylate, 1-isocyanotocarbonyl styrene, glycidylacrylate, glycidyl methacrylate, and allyl glycidyl ether. Another type of photosensitive R* group is a photo-bridgeable monomeric chemical based on an azide derivative (e.g. 2-(dimethylamino)ethyl azidobenzilate). These photosensitive precursors were formed with a photoinitiator (or photoinitiator mixture ) and a co-photosensitizer/or radical transfer agent. N-methyl-2-pyrolidone (NMP) was used as a solvent; however, other solvents may also be used. The photoinitiator can be chosen according to its i-line activity, g-line activity and full spectrum of a Hg lamp activity.

Examples of photoinitiators are Michler's ketone, benzoin, 2,6-bis(4-azidobenzylidene)4-methylcyclohexanone and its derivatives, benzil, 2,3-butanedione, 4,4-dimethoxy benzoin, substituted thioxanthones, such as 2-propoxy thioxanthone 2,2-dimethoxy-2-phenylacetophenone, benzoin ethyl ether, benzoin isopropyl ether, benzoin methyl ether, and 2-(n-butoxy) ethyl-4 dimethylaminobenzoate. Examples of a photosensitizer for radical transfer are N-phenyldiethanolamine, 2-methoxy ethanol, N-phenyl-ethanolamine, N-phenyl-N-methylethanolamine, and N-phenyl-N-ethylethanolamine.

The developers which should be used depend upon the type of photosensitive group which is attached. Specifically, whether it is a salt type or permanent bonded type (namely, amide or ester linkage) will influence the choice of developer. For a salt complex type of photosensitive BPDA-ODA formulation both an alcoholic NMP solution and an aqueous NMP solution gave a very nice differential dissolution gradient for unexposed and exposed BPDA-ODA precursor. Examples include: ethanol/NMP (10/90, 20/80, and 30/70, V/V), methanol/NMP (10/90, 20/80, and 30/70, V/V), isopropanol mixture (with ethanol or methanol)/NMP (10/90, 20/80 and 30/70, V/V), and water/NMP solution (10/90, 20/80, 30/70, 40/60, and 50/50, V/V). Isopropanol, n-propanol, ethanol, and water can be used as rinsers. For a amide-/or ester-linkage type of BPDA-ODA formulation, an aqueous NMP solution and a benzene derivative/NMP solution developed good images. Examples are water/NMP (10/90, 20/80 and 30/70, V/V), xylene/NMP (20-50/80-50, V/V), and toluene/NMP (20-50/80-50, V/V). Suitable rinsers included isopropanol or ethanol for water/NMP developer, and xylene or toluene for xylene/NMP or toluene/NMP developer.

EXAMPLE I

The monomers of biphenyltetracarboxylic dianhydride (BPDA) and 4,4'oxydiphenylene diamine (ODA) were commercial materials which were once sublimed through $Al_2O_3$ to remove colored contaminants followed by a second sublimation to insure complete dryness. The solvent, N-methyl-2-pyrrolidone (NMP), was distilled under argon at reduced pressure from the mixture with $P_2O_5$. Polymerizations were conducted in a glove box filled with helium gas using a predetermined monomer stoichiometry to yield a weight average molecular weight of 40,000 to 50,000. 0.300 moles of the diamine was dissolved in 700 g of dry NMP and then 0.300 moles of the powdered dianhydride was slowly added with vigorous stirring. The polymerization mixture was stirred for 24 hours to 48 hours, filtered through 1 μm Fluoropore filters, and stored at a refrigerator at 0° C. to 5° C. in sealed glass bottles. The final polymer concentration was 17.5 wt. %.

EXAMPLE II 4.500 g 2-(dimethylamino)ethyl methacrylate was mixed with 2.000 g NMP, and then added into 35.280 g BPDA-ODA poly(amic acid) solution (17.5 wt. %. polymer concentration) in NMP. This mixture solution in a glass bottle was mixed on a rubber roller machine for 5 hours. 0.110 g N-phenyldiethanolamine and 0.130 g Michler's ketone were dissolved in 2.000 g NMP, added into the photosensitive BPDA-ODA precursor solution, and then mixed again for 3 hours.

Silicon oxide wafers were used as a substrate. The wafers were prime-coated with 0.1 vol. % 3-aminopropyltriethoxysilane aqueous or alcoholic solution at 2000 rpm/20 sec, and baked at 120° C. for 20 min. The photosensitive BPDA-ODA formulation was spin-coated on the wafers at 500 rpm/5 sec plus 1000 rpm/30 sec, and then softbaked on a hot-plate at 80° C. for 30 min in atmosphere. The thickness of softbaked samples was 18.1 μm.

The softbaked samples were exposed to full spectrum of a Hg lamp on a Tamarack (Model 145) projection printer. Then, expose energy was in the range of 18 mj/cm2–720 mj/cm2 (based at i-line). The exposed samples were developed by dipping into a developer in an ultrasonic bath filled with water, then rinsed in isopropanol, and dried using N2 gun. The developing temperature was 23° C.–27° C. The developer used was an alcoholic NMP solution of ethanol/NMP (20/80, V/V). The developing time was 2 min to 7 min. Clean, well defined images were obtained at 36 mj/cm2 to 200 mj/cm2 expose energy (based at i-line). The patterned samples were thermally imidized in an oven under N2 gas flow through. the curing procedure of 150° C./30 min+200° C./30 min+300° C./30 min+400° C./60 min. The BPDA-ODA film thickness was 18.1 μm after softbake, 16.3 μm after develop, and 8.9 μm after cure. In general, the thickness loss was 3 μm or less during developing.

For measurements of mechanical properties, the photosensitive BPDA-ODA formulation was spin-coated on silicon wafers softbaked at 80° C. for 30 min., and thermally imidized in an oven under N2 flow through the stepcure process of 150° C./30 min+200° C./30 min+300° C./30 min+400° C./60 min. The thickness of cured samples was 9.60 μm–11.62 μm. The cured BPDA-ODA films on silicon wafers were diced in 3.175 mm width in a thin film dicer. The diced strip films were easily taken off the wafer substrates. The strip films were mounted on an aluminum foil sample folder using an expoxy glue for easy mounting on an Instron. The gauge length was approximately 50 mm and the cross head speed was 10 mm/min. A stress-strain curve was plotted and the modulus and ultimate tensile strength were 4.0 Gpa and 201.5 Mpa, respectively. The elongation at break was 90% to 110%. These values are comparable with BPDA-ODA polyimide which is not photosensitive. Hence, the experiments demonstrated that all the properties of the original BPDA-ODA polyimide are maintained when a photosensitive group is attached to the BPDA-ODA precursor backbone.

Good dynamic mechanical and thermal behavior was demonstrated for the photosenstive BPDA-ODA film. The storage modulus dropped sharply at the first transition temperature, ca. 290° C., and then almost leveled off up to 430° C. The final big drop of the storage modulus began at approximately 430° C. The drop of the modulus at the first transition was reasonable and should provide enough molecular motions to give a good self-adhesion as occurs in the non-photosensitive BPDA-ODA polyimide. After the first transition, the modulus is well maintained to still give a good modulus value which can provide a good dimensional and thermal stability for the temperature range of 300° C. to 440° C.

EXAMPLE III 8.40 g isocyanatoethyl methacrylate was first mixed with 5.00 g NMP, and then added into 77.69 g BPDA-ODA (17.5 wt. %) solution in a small amount several times under well mixing. Through this addition of isocyanate-terminated methacrylate into the poly(amic acid), the methacrylate groups were attached on the polymer backbone by the chemical reaction of isocyanate group with carboxylic acid groups of the backbone. The reaction time was approximately five hours. The photosensitive group functionalized BPDA-ODA precursor solution was formulated with a photoinitiator, Miehler's ketone, at 0.20 g, and a radical transferor, 2-methoxy ethanol, at 0.20 g. The initiator and radical transfer agent were dissolved in 2.000 g NMP before being added into the photosensitive BPDA-ODA precursor solution.

The BPDA-ODA formulation was spin-coated on the 3-aminopropyltriethoxysilane coated SiO2 wafers at 700 rpm/5 see and 1000 rpm/30 sec, softbaked at 80° C. for 30 rain, and exposed to full spectra of a Hg lamp on a Tamarack projection printer. The expose energy was 50 mj/cm$^2$–720 mj/cm$^2$ (based at i-line). Normally, the expose energy of 90 mj/cm$^2$–600 mj/cm$^2$ gave nice images and good resolution. The exposed samples were postbaked on a hot plate at 90° C. for 20 min. before developing. The postbaked samples were developed in an NMP solution (water/NMP=20/80, V/V) or (xylene/NMP=40/60, V/V) using an ultrasonic bath, and then rinsed in isopropanol or xylene. The rinsed samples were dried by N$_2$ gun. The temperature during was 25±2° C. The developing time was 5 min to 10 min. In this case, the thickness of the postbaked sample and its developed sample was 27.68 $\mu$m and 26.80 $\mu$m, respectively. The final cured thickness was 14.79 $\mu$m. The 9.8 $\mu$m lines of the pattern were clearly opened.

EXAMPLE IV 4.16 g of glycidyl methacrylate was dissolved into 2.00 g NMP, added into 35.21 g of BPDA-ODA (17.5 wt. %) solution in NMP, and then well mixed at room temperature for 5 hours. Then, Michler's ketone of 0.16 g and N-phenyldiethanolamine of 0.15 g in 2.00 g NMP were added into the solution and well mixed for 3 hours.

The formulation was applied on silicon oxide wafers prime-coated with 3-aminopropyltriethoxysilane adhesion promoter by spin-coating at 500 rpm/5 sec plus 1000 rpm/10 sec. The coated wafers were softbaked on a hotplate at 80° C. for 40 min in atmosphere. The softbaked samples were exposed to full spectrum of a Hg lamp on a Tamarack projection printer. The exposure energy was 18 mj/cm2 to 600 mj/cm2. The samples were developed in water/xylene (20/80) in an ultrasonic bath at 23° C. to 27° C. and followed by rinsing in isopropyl alcohol. Nice patterns were obtained, but a large thickness loss occurred during developing. This fact indicates that the developer did not provide a good differential dissolution gradient to maintain the original thickness. This formulation kept the good mechanical properties after curing which are observed with polyimide prepared from a non-photosensitive BPDA-ODA poly(amic acid) solution.

EXAMPLE V 5.188 g 2-(dimethylamino)ethyl methacrylate was mixed with 5.000 g NMP, and then added into 48.320 g BPDA-PDA poly(amic acid) solution (13.5 wt. % polymer concentration) in NMP. This mixture solution was mixed on a rubber roller machine for 4 hours. 150 g N-phenyldiethanolamine and 0.150 g Michler's ketone were dissolved in 8.000 g NMP, added into the photosensitive BPDA-PDA precursor solution and then mixed again for 3 hours.

Silicon oxide wafers were used as substrates. The wafers were primecoated with 0.1 volume % 3-aminopropyltriethoxysilane aqueous solution at 2000 rpm/20 seconds, and baked at 120° C. for 20 minutes. The photosensitive BPDA-PDA formulation was spincoated on the wafers at 500 rpm/5 seconds plus 1000 rpm/18 seconds, and then softbaked on a hot-plate at 80° C. for 15 minutes in atmosphere. The thickness of softbaked samples was approximately 20 $\mu$m. The softbaked samples were exposed to broad banded Hg lamp on a Tamarack (Model 145) projection printer. The exposure energy was in the range of 18 mj/cm2–720 mj/cm2 (based at i-line). The exposed samples were developed by dipping into a developer in an ultrasonic bath filled with water, then rinsed in isopropanol, and dried using N2 gun. The developing temperature was 23° C.–27° C. The developer used was an alcoholic NMP solution of ethanol/NMP (20/80, V/V). Well-defined images were obtained at 36 mJ/cm2–200 mJ/cm2 exposure energy (based at i-line). Very well defined patterns were obtained at 90 mJ/cm2. The developing time varied by 5–20 minutes depending on the exposure energy variation. The patterned samples were thermally imidized in an oven under N2 gas flow by a step-curing procedure as follows: 150° C./30 minutes–200° C./30 minutes–300° C./30 minutes–400° C./60 minutes. The film thickness was 18.5 $\mu$m after softbake, 17.0 $\mu$m after develop, and 9.0 $\mu$m after cure. During the developing the thickness loss was approximately 8% of the thickness after softbake. In general, the thickness loss was approximately 2 $\mu$m or less during developing. For the 18.5 $\mu$m thickness after softbake, lines of $\geq$14 $\mu$m were opened.

For measurements of mechanical properties, the photosensitive BPDA-PDA formulation was spin-coated on silicon wafers, softbaked at 80° C. for 30 minutes, and thermally imidized in an oven under N2 flow through the step-cure process of 150° C./30 minutes–200° C./30 minutes–300° C./30 minutes–400° C./60 minutes. The thickness of cured samples was 9.00 $\mu$m–11.45 $\mu$m. The BPDA-PDA films on silicon wafers were diced in 3.175 mm width on a thin film dicer. The diced strip films were easily taken off the wafer substrates. The strip films were mounted on aluminium foil sample folder using an epoxy glue for easy mounting on an Instron. The gauge length was ca. 50 mm and the cross head speed was 10 mm/min. The modulus and ultimate tensile strength were 10.5 GPa and 350 MPa, respectively. The elongation at break was 45%. These values are comparable with those of the polyimide produced from a non-photosensitive BPDA-PDA precursor solution.

EXAMPLE VI 4.900 g isocyanotoethyl methacrylate was first mixed with 4.900 g NMP then added into 44.230 g BDPA-PDA (13.5 wt. %) solution in a small amount several times under well mixing. Through this addition of isocyanate-terminated methacrylate into the poly(amide acid), the methacrylate groups were attached on the polymer backbone by the chemical reaction of isocyanate group with carboxylic acid groups of the backbone. The reaction time was approximately four hours. The photosensitive group functionalized BPDA-PDA precursor solution was formulated with a photoinitiator, Michler's ketone, and a radical transfer agent, 2-methoxy ethanol. The initiator and radical transfer agent were dissolved in NMP before being added into the photosensitive BPDA-PDA precursor solution.

The BPDA-PDA formulation was spin-coated on the 3-aminopropyltriethoxysilane coated $SiO_2$ at 1200 rpm/10 seconds, softbaked at 80° C. for 20 minutes, and exposed to full spectra of Hg lamp on a Tamarack projection printer. The exposure energy was 50 mj/cm2–720 mj/cm2 (based at i-line). Normally, the exposure energy of 90 mj/cm2–360 mj/cm2 gave well-defined images and good resolution. The exposed samples were developed in an NMP solution (water NMP=20/80, V/V) or (xylene/NMP=40/60, V/V) using an ultrasonic bath, and then rinsed in isopropanol or xylene. The rinsed samples were dried by N2 gun. The temperature was 25°±2° C. Well-defined patterns were obtained with 28 μm lines clearly opened.

EXAMPLE VII

For the low internal stress (or low thermal expansion) photosensitive poly(p-phenylene biphenyltetracarboximide) (BPDA-PDA) precursor formulation, the further physical characteristics were measured. Specifically, the internal stress and the related thermal expansion coefficient were investigated. For the samples which were thermally imidized by a step cure such as 80° C./30 min plus 150° C./30 min plus 200° C. (or 230° C.)/30 min plus 300° C./30 min plus 400° C./60 min, the internal stress of approximately 3.5 kpsi was obtained by means of x-ray wafer bending. From the internal stress result, the thermal expansion coefficient was approximately 8.5 ppm/°C. These values are much lower than those (6 kpsi to 8 kpsi internal stress and 40 ppm/°C. to 80 ppm/°C. thermal expansion coefficient) obtained from curing other photosensitive polyimide precursor formulations commonly cited in literature.

EXAMPLE VIII

In Examples VIII and XI, the lithographic sensitivity was also improved by the following modification for the formulation. Namely, the photosensitivity and the resolution were improved using a g-line active bisazide and its combination with highly g-line sensitive sensitizers such as Coumarin 7, Coumarin 314, and Coumarin 334.

7.43 g of 2-(dimethylamino)ethyl methacrylate in 5.0 g NMP was added to 70.4 g BPDA-PDA poly(amide acid) solution with 13.5 wt. % solid, and then mixed at a roller mixer for 5 hours. 2,6 -Bis(4-azidobenzylidene)-4-methyleyclohexanone (a bisazide photoinitiator) of 0.2 g was added to the solution, and then mixed again. This was followed by the addition of 0.2 g N-phenyldiethanolamine. Then, the mixture was roller-mixed for five hours. Here, the bisazide photoinitiator is active to both i-line and g-line; the molar absorption (or extinction) coefficient is $3 \times 10^4$ L/(mole cm) at i-line and 1,600 L/(mole era) at g-line.

For examples VII and VIII, the softbake condition was 80° C./30 minutes in a convection oven with air flow. The proper exposure dose was 300 mj/cm2 to 600 mj/cm2 at g-line on a planarized polyimide coated ceramic substrate. These formulations also worked very well at both i-line and full spectrum of Hg lamp. The developer also was further optimized through a detailed screening test. The best developer was NMP/methanol/water=70/15/15 in volume ratio. With this developer, the developing time was approximately 15 mins at 25° C. The resolution was 12 μm to 15 μm.

EXAMPLE IX 8.50 g 2-(dimethylamino)ethyl methacrylate in 5.0 g NMP was added to 80.00 g BPDA-PDA poly(amic acid) solution (13.5 wt. % solid content), and then mixed with the aid of a roller mixer for four hours. 0.3 g N-phenyldiethanolamine was added to the solution, and mixed for 2 hours. Then, for improving the photosensitivity at g-line, the photopackage of 2,6-bis(4-azidobenzylidene)-4-methylcyclohexanone combined with Coumarin 7 (a g-line sensitizer, 3-(2'-benzimidazolyl)-7-N,N-diethylaminocoumarin, of $5.0 \times 10^4$ L/(mole cm) very high molar absorption coefficient) or Coumarin 314 ($4.5 \times 10^4$ L/(mole cm) molar extinction coefficient) was added to the solution.

EXAMPLE X

Experiments showed the photosensitive BPDA-PDA formulation (BPDA-PDA photosensitive polyimide (PSPI)) worked very well for negative patterning. However, its developing time was slightly longer than that of BPDA-ODA PSPI formulation. The relatively longer developing time of BPDA-PDA PSPI is due to its intrinsically lower solubility in the developer.

The development time of the BPDA-PDA PSPI was reduced to a convenient range of development times by mixing the mixture of BPDA-PDA PSPI with BPDA-ODA PSPI. For BPDA-PDA mixture PSPI formations, two BPDA-ODA polyimide precursors, poly(4,4'-oxydiphenylene biphenyltetracarboxamic acid) (BPDA-4,4'-ODA) or poly(3,4'-oxydiphenylene biphenyltetracarboxamic acid) (BPDA-3,4'-ODA), were used as a minor components in the mixtures. The lithography of the mixture PSPI was superior to the homo BPDA-PDA PSPI. The uniformity in the development of negative pattern was excellent. The proper mixture composition range was 95/5–80/20 BPDA-PDA PSPI/BPDA-ODA PSPI, wt/wt. For both softbaked and thermally cured samples, phase-separated domains were not detected through optical microscope, indicating that the domain size is much less than 0.5 μm if they are phase-separated. The optimized composition was 85/15 (=BPDA-PDA PSPI/BPDA-ODA PSPI, wt/wt). The superior properties such as low internal stress, low thermal expansion, and mechanical properties of BPDA-PDA PSPI were well maintained through this mixture modification. Namely, the internal stress was 2.9 kpsi to 3.5 kpsi. The modulus was >8 GPa with the ultimate tensile strength of >350 MPa and the elongation at break was >40%. The adhesion was improved by aid of BPDA-ODA PSPI component which itself exhibits excellent adhesion. As examples of mixed PSPIs, the following six photopackages were used for sensitivity to i-line (365 nm), g-line (436 nm) and broad band of Hg lamp (here, the wt. % of a component is based on the total polymer weight);

1) N-(dimethylamino)ethyl methacrylate—100% equivalent loaded. 2,6-bis(4-azidobenzylidene)-4-methylcyclohexanone—2 to 5 wt. %. Coumarin 7 or Coumarin 314 or Coumarin 334—0.01 to 0.5 wt. %. N-phenyldiethanolamine—2 to 10 wt. %.
2) same as (1) without Coumarin sensitizer.
3) N-(dimethylamino)ethyl methacrylate—100% equivalent loaded 2,6-bis(4-azidobenzylidene)-4-methylcyclohexanone—2 to 5 wt. % 2-propoxythioxanthone—2 to 10 wt. %. N-phenyldiethanolamine—2 to 10 wt. %.
4) N-(dimethylamino)ethyl methacrylate—100% equivalent loaded. Michler's Ketone—2 to 5 wt. %. Coumarin 7 or Coumarin 314 or Coumarin 334—0.01 to 0.5 wt. %. N-phenyldiethanolamine—2 to 10 wt. %.
5) N-(dimethylamino)ethyl methacrylate—100% equivalent loaded. 2,6-bis(4-azidobenzylidene)—4-methylcyclohexanone—2 to 5 wt. %. Michler's Ketone—2 to 5 wt. %. N-phenyldiethanolamine—2 to 10 wt. %.
6) same as (4) with Coumarin 7 (or Coumarin 314 or Coumarin 334) of 0.01 to 0.5 wt. %.

For all the BPDA-PDA/BPDA-ODA Mixture PSPI formulations, the optimized developer was NMP/Methanol/Water (=70/15/15, v/v/v) and the developing temperature was 25°+3° C. An ultrasonic aid is necessary in developing. With g-line, the proper exposure energy was 400-600 mJ/cm2 on a planarized coated ceramic substrate and a silicon wafer. Among the above various formulations, an example is shown below:

| Formulation: | |
|---|---|
| BPDA-PDA amic acid solution (13.5 wt. %): | 190.68 g |
| BPDA-4,4'-ODA amic acid solution (17.5 wt. %): | 25.94 g |
| N-(dimethylamino)ethyl methacrylate: | 25.00 g |
| 2,6-bis(4-azidobenzylidene)-4-methylcyclo hexanone: | 1.01 g |
| N-phenyldiethanolamine: | 0.84 g |

Spin-Coating: 500 rpm/10 sec+2000 rpm/20 sec
Softbake:
1) 80° C./25 min in convection oven with air flow for wafer.
2) 80° C./30 min in the same oven for ceramic substrate.

Exposure: 400 to 500 mJ/cm2 with g-line on Canon scanning exposure tool.
Developing: in 70 v. % NMP/15 v % MeOH/15 v. % Water with aid of ultrasonic;
1) for wafer, 8 min developing time at 27° C.
2) for ceramic, 16 min developing time at 22° C. Resolution: 12 μm to 14 μm lines/vias open. Thickness: ca. 17 μm (the thickness loss was controlled within 10%).

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A photosensitive polyamic acid precursor having the following formula:

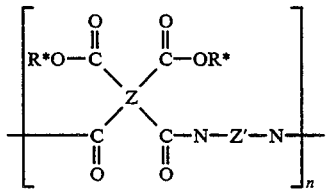

wherein Z is selected from the group consisting of biphenyl, pyromellitic, and benzophenone moieties, wherein Z' is selected from the group consisting of phenylene, diphenyl ether, and diphenyl methane moieties, and wherein R* is 2-(dimethylamino)ethylazidobenzilate.

2. The photosensitive polyamic acid precursor recited in claim 1 wherein Z is a biphenyl and Z' is selected from the group consisting of 4,4'-oxydiphenylene and p-phenylene.

* * * * *